US011906299B2

(12) United States Patent
Seki et al.

(10) Patent No.: US 11,906,299 B2
(45) Date of Patent: Feb. 20, 2024

(54) PLATING APPARATUS AND FILM THICKNESS MEASURING METHOD FOR SUBSTRATE

(71) Applicant: EBARA CORPORATION, Tokyo (JP)

(72) Inventors: Masaya Seki, Tokyo (JP); Masaki Tomita, Tokyo (JP); Shao Hua Chang, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 248 days.

(21) Appl. No.: 17/616,906

(22) PCT Filed: Jan. 20, 2021

(86) PCT No.: PCT/JP2021/001833
§ 371 (c)(1),
(2) Date: Dec. 6, 2021

(87) PCT Pub. No.: WO2022/157852
PCT Pub. Date: Jul. 28, 2022

(65) Prior Publication Data
US 2023/0152077 A1 May 18, 2023

(51) Int. Cl.
G01B 7/06 (2006.01)
C25D 17/00 (2006.01)
(Continued)

(52) U.S. Cl.
CPC .............. *G01B 7/06* (2013.01); *C25D 5/007* (2020.08); *C25D 17/005* (2013.01); *C25D 17/02* (2013.01);
(Continued)

(58) Field of Classification Search
CPC .......... G01B 7/06; G01B 7/105; C25D 5/007; C25D 17/005; C25D 17/02; C25D 17/10;
(Continued)

(56) References Cited

U.S. PATENT DOCUMENTS

| 6,280,581 B1* | 8/2001 | Cheng ...................... C25D 5/08 204/224 R |
| 2004/0173454 A1* | 9/2004 | Olgado .................. C25D 7/123 257/E21.175 |
| 2014/0144781 A1* | 5/2014 | He ....................... C25D 17/007 204/229.4 |

FOREIGN PATENT DOCUMENTS

| JP | 2000-232078 A | 8/2000 |
| JP | 2000232078 A * | 8/2000 ........... C25D 17/001 |

(Continued)

*Primary Examiner* — Daniel R Miller
(74) *Attorney, Agent, or Firm* — BakerHostetler

(57) ABSTRACT

Provided is a technique that allows measuring a film thickness of a substrate in a plating process.

A plating apparatus 1000 includes a plating tank 10, a substrate holder 20, a rotation mechanism 30, a plurality of contact members 50, a coil 60, a current sensor 65, and a film thickness measuring device 70. The plurality of contact members 50 are disposed in a substrate holder and arranged in a circumferential direction of the substrate holder. The plurality of contact members 50 contact an outer peripheral edge of a lower surface of a substrate to supply electricity to the substrate in the plating process. The coil 60 generates a current by an electromagnetic induction due to a magnetic field generated by a current flowing into the contact member, the contact member being rotate together with the substrate holder in the plating process. The current sensor 65 detects the current generated in the coil. The film thickness measuring device 70 measures a film thickness of the substrate based on the current detected by the current sensor in the plating process.

4 Claims, 6 Drawing Sheets

(51) Int. Cl.
  *C25D 17/02*  (2006.01)
  *C25D 17/10*  (2006.01)
  *C25D 21/14*  (2006.01)
  *G01R 15/12*  (2006.01)
  *G01R 15/18*  (2006.01)
  *C25D 5/00*   (2006.01)

(52) U.S. Cl.
  CPC .............. *C25D 17/10* (2013.01); *C25D 21/14* (2013.01); *G01R 15/12* (2013.01); *G01R 15/181* (2013.01)

(58) Field of Classification Search
  CPC ........ C25D 21/14; C25D 7/123; C25D 17/00; C25D 17/001; C25D 21/12; G01R 15/12; G01R 15/181
  See application file for complete search history.

(56) References Cited

FOREIGN PATENT DOCUMENTS

| | | |
|---|---|---|
| JP | 2008-019496 A | 1/2008 |
| JP | 2019-175934 A | 10/2019 |
| KR | 2010-0063248 A | 6/2010 |

* cited by examiner

PLATING APPARATUS AND FILM THICKNESS MEASURING METHOD FOR SUBSTRATE

TECHNICAL FIELD

The present invention relates to a plating apparatus and a film thickness measuring method for substrate.

BACKGROUND ART

Conventionally, there has been known what is called a cup type plating apparatus as a plating apparatus that can perform a plating process on a substrate (for example, see PTL 1). The plating apparatus includes a plating tank that stores a plating solution and internally includes an anode, a substrate holder disposed above the anode and holds the substrate as a cathode, and a rotation mechanism that rotates the substrate holder when performing the plating process on the substrate.

CITATION LIST

Patent Literature

PTL 1: Japanese Unexamined Patent Application Publication No. 2008-19496

SUMMARY OF INVENTION

Technical Problem

A conventional plating apparatus such as the one described above was not configured to be capable of measuring the film thickness of the substrate in the plating process.

The present invention has been made in view of the above, with an object to provide a technique for measuring the film thickness of the substrate in the plating process.

Solution to Problem

[Aspect 1] To achieve the above-described object, a plating apparatus according to one aspect of the present invention includes a plating tank, a substrate holder, a rotation mechanism, a plurality of contact members, a coil, a current sensor, and a film thickness measuring device. The plating tank is configured to store a plating solution and internally includes an anode. The substrate holder is disposed above the anode and configured to hold a substrate as a cathode. The rotation mechanism is configured such that the rotation mechanism rotates the substrate holder when a plating process is performed on the substrate. The plurality of contact members are disposed in the substrate holder and arranged in a circumferential direction of the substrate holder. The plurality of contact members are configured to contact an outer peripheral edge of a lower surface of the substrate to supply electricity to the substrate in the plating process. The coil is configured to generate a current by an electromagnetic induction due to a magnetic field caused by a current flowing into the contact member. The contact member is configured to rotate together with the substrate holder in the plating process. The current sensor is configured to detect the current generated in the coil. The film thickness measuring device is configured to measure a film thickness of the substrate based on the current detected by the current sensor in the plating process.

According to this aspect, the film thickness of the substrate can be measured in the plating process.

[Aspect 2] In aspect 1 described above, the coil may be disposed to have a space from the substrate holder outside the substrate holder in a radial direction of the substrate holder.

[Aspect 3] In aspect 1 or 2 described above, the plurality of contact members are disposed equally in the circumferential direction of the substrate holder, and the current sensor may be configured to detect a current generated in the coil by the electromagnetic induction due to the magnetic field caused by the contact member that has most closely approached the coil, among the contact members configured to rotate together with the substrate holder in the plating process.

According to this aspect, a distribution of a film thickness in the circumferential direction of the substrate can be measured.

[Aspect 4] To achieve the above-described object, a film thickness measuring method for substrate according to one aspect of the present invention uses a plating apparatus. The plating apparatus includes a plating tank, a substrate holder, a rotation mechanism, a plurality of contact members, and a coil. The plating tank is configured to store a plating solution and internally includes an anode. The substrate holder is disposed above the anode and configured to hold a substrate as a cathode. The rotation mechanism is configured such that the rotation mechanism rotates the substrate holder when performing a plating process on the substrate. The plurality of contact members are disposed in the substrate holder and arranged in a circumferential direction of the substrate holder. The plurality of contact members are configured to contact an outer peripheral edge of a lower surface of the substrate to supply electricity to the substrate in the plating process. The coil is configured to generate a current by an electromagnetic induction due to a magnetic field caused by a current flowing into the contact member. The contact member is configured to rotate together with the substrate holder in the plating process. The film thickness measuring method includes: detecting the current generated in the coil in the plating process; and measuring a film thickness of the substrate based on the detected current.

According to this aspect, the film thickness of the substrate can be measured in the plating process.

DESCRIPTION OF EMBODIMENTS

The following describes embodiments of the present invention with reference to the drawings. The drawings are schematically illustrated for ease of understanding features of matters, and a dimensional proportion of each component or the like is not always identical to that of an actual component. Furthermore, for some drawings, X-Y-Z orthogonal coordinates are illustrated for reference purposes. Of the orthogonal coordinates, the Z direction corresponds to the upper side, and the −Z direction corresponds to the lower side (the direction where gravity acts).

Figure 1:
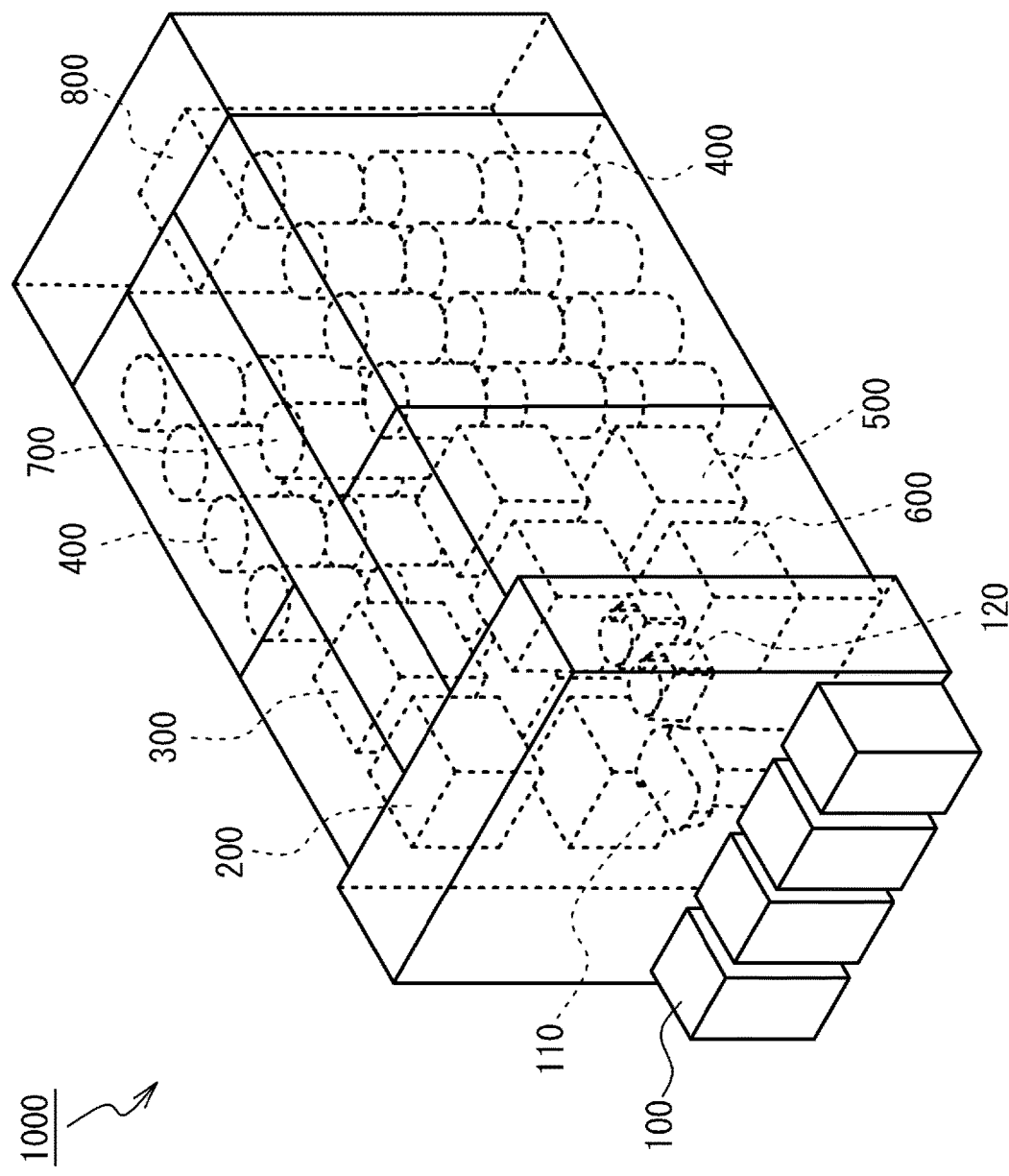
FIG. 1 is a perspective view illustrating an overall configuration of a plating apparatus according to an embodiment.
Figure 2:
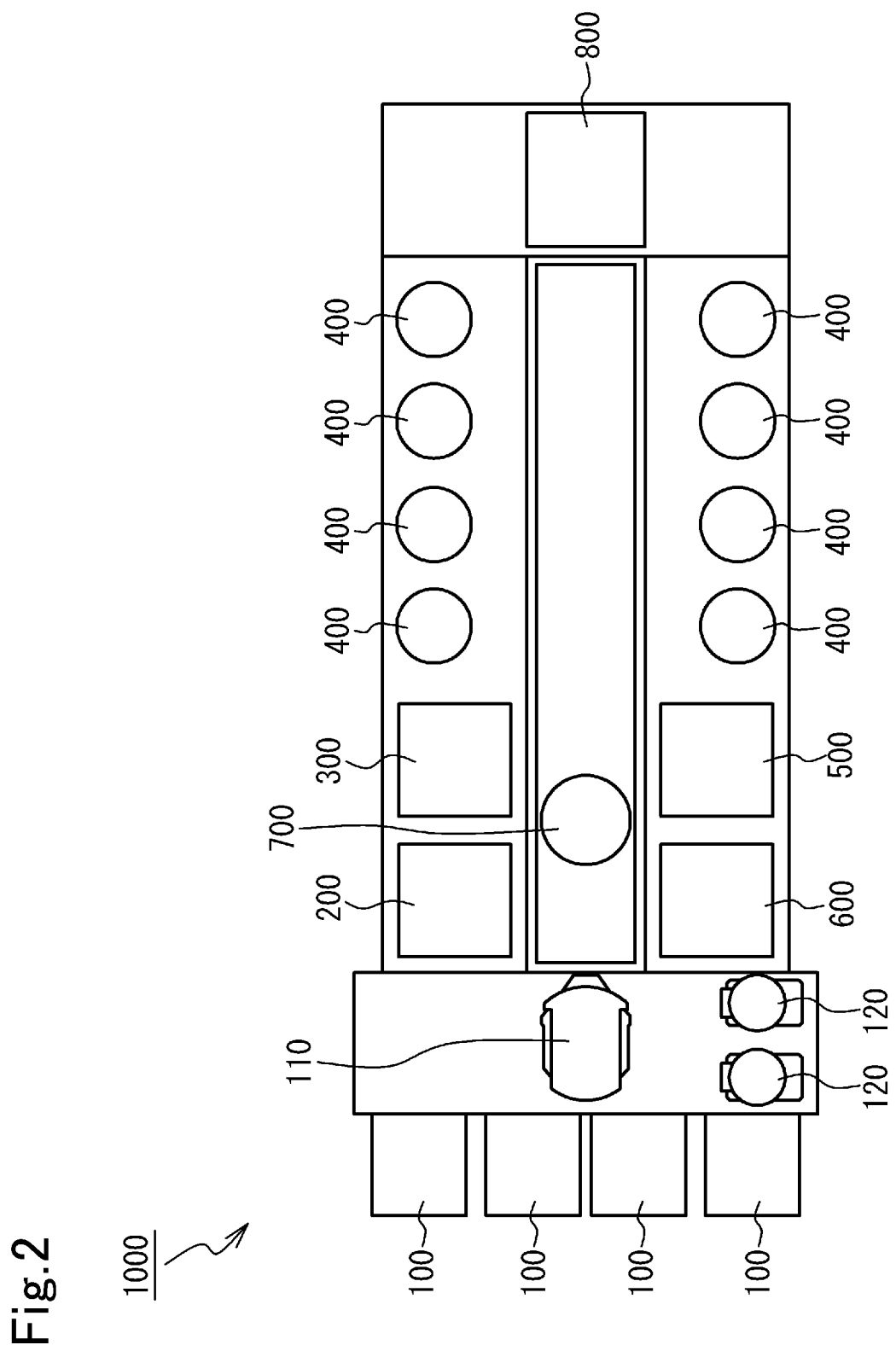
FIG. 2 is a plan view illustrating the overall configuration of the plating apparatus according to the embodiment.

FIG. 1 is a perspective view illustrating the overall configuration of a plating apparatus 1000 of this embodiment. FIG. 2 is a plan view illustrating the overall configuration of the plating apparatus 1000 of this embodiment. As illustrated in FIGS. 1 and 2, the plating apparatus 1000 includes load ports 100, a transfer robot 110, aligners 120, pre-wet modules 200, pre-soak modules 300, plating modules 400, cleaning modules 500, spin rinse dryers 600, a transfer device 700, and a control module 800.

The load port 100 is a module for loading a substrate housed in a cassette, such as a FOUP (not illustrated), to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, and the transfer device 700. The transfer robot 110 and the transfer device 700 can perform delivery and receipt of the substrate via a temporary placement table (not illustrated) to grip or release the substrate between the transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary. The pre-wet module 200 wets a surface to be plated of the substrate before a plating process with a process liquid, such as pure water or deaerated water, to replace air inside a pattern formed on the surface of the substrate with the process liquid. The pre-wet module 200 is configured to perform a pre-wet process to facilitate supplying the plating solution to the inside of the pattern by replacing the process liquid inside the pattern with a plating solution during plating. While the two pre-wet modules 200 are disposed to be arranged in the vertical direction in this embodiment, the number of pre-wet modules 200 and arrangement of the pre-wet modules 200 are arbitrary.

For example, the pre-soak module 300 is configured to remove an oxidized film having a large electrical resistance present on a surface of a seed layer or the like formed on the surface to be plated of the substrate before the plating process by etching with a process liquid, such as sulfuric acid and hydrochloric acid for performing a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrates. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The cleaning module 500 is configured to perform a cleaning process on the substrate to remove the plating solution or the like left on the substrate after the plating process. While the two cleaning modules 500 are disposed to be arranged in the vertical direction in this embodiment, the number of cleaning modules 500 and arrangement of the cleaning modules 500 are arbitrary. The spin rinse dryer 600 is a module for rotating the substrate after the cleaning process at high speed to dry the substrate. While the two spin rinse dryers 600 are disposed to be arranged in the vertical direction in this embodiment, the number of spin rinse dryers 600 and arrangement of the spin rinse dryers 600 are arbitrary. The transfer device 700 is a device for transferring the substrate between the plurality of modules inside the plating apparatus 1000. The control module 800 is configured to control the plurality of modules in the plating apparatus 1000 and can be configured of, for example, a general computer including input/output interfaces with an operator or a dedicated computer.

An example of a sequence of the plating processes by the plating apparatus 1000 will be described. First, the substrate housed in the cassette is loaded on the load port 100. Subsequently, the transfer robot 110 grips the substrate in the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the transfer device 700.

The transfer device 700 transfers the substrate received from the transfer robot 110 to the pre-wet module 200. The pre-wet module 200 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate.

The transfer device 700 transfers the substrate on which the plating process has been performed to the cleaning module 500. The cleaning module 500 performs the cleaning process on the substrate. The transfer device 700 transfers the substrate on which the cleaning process has been performed to the spin rinse dryer 600. The spin rinse dryer 600 performs the drying process on the substrate. The transfer device 700 grips or releases the substrate on which the drying process has been performed to the transfer robot 110. The transfer robot 110 transfers the substrate received from the transfer device 700 to the cassette at the load port 100. Finally, the cassette housing the substrate is unloaded from the load port 100.

The configuration of the plating apparatus 1000 described in FIGS. 1 and 2 is merely an example, and the configuration of the plating apparatus 1000 is not limited to the configuration of FIGS. 1 and 2.

Subsequently, the plating module 400 will be described. Since a plurality of the plating modules 400 included in the plating apparatus 1000 according to this embodiment have similar configurations, only one plating module 400 will be described.

Figure 3:
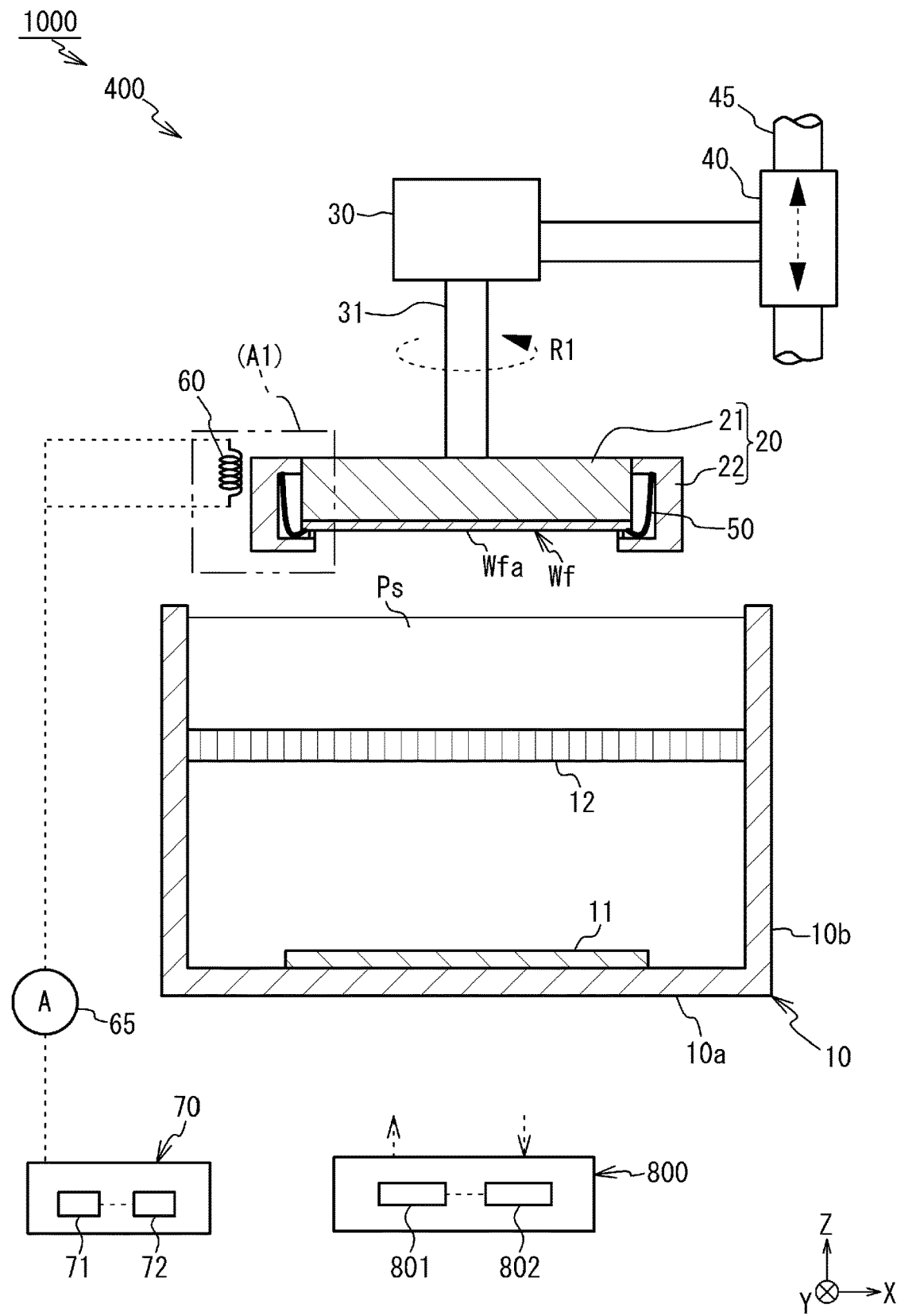
FIG. 3 is a schematic diagram for describing a configuration of a plating module of the plating apparatus according to the embodiment.
Figure 4:
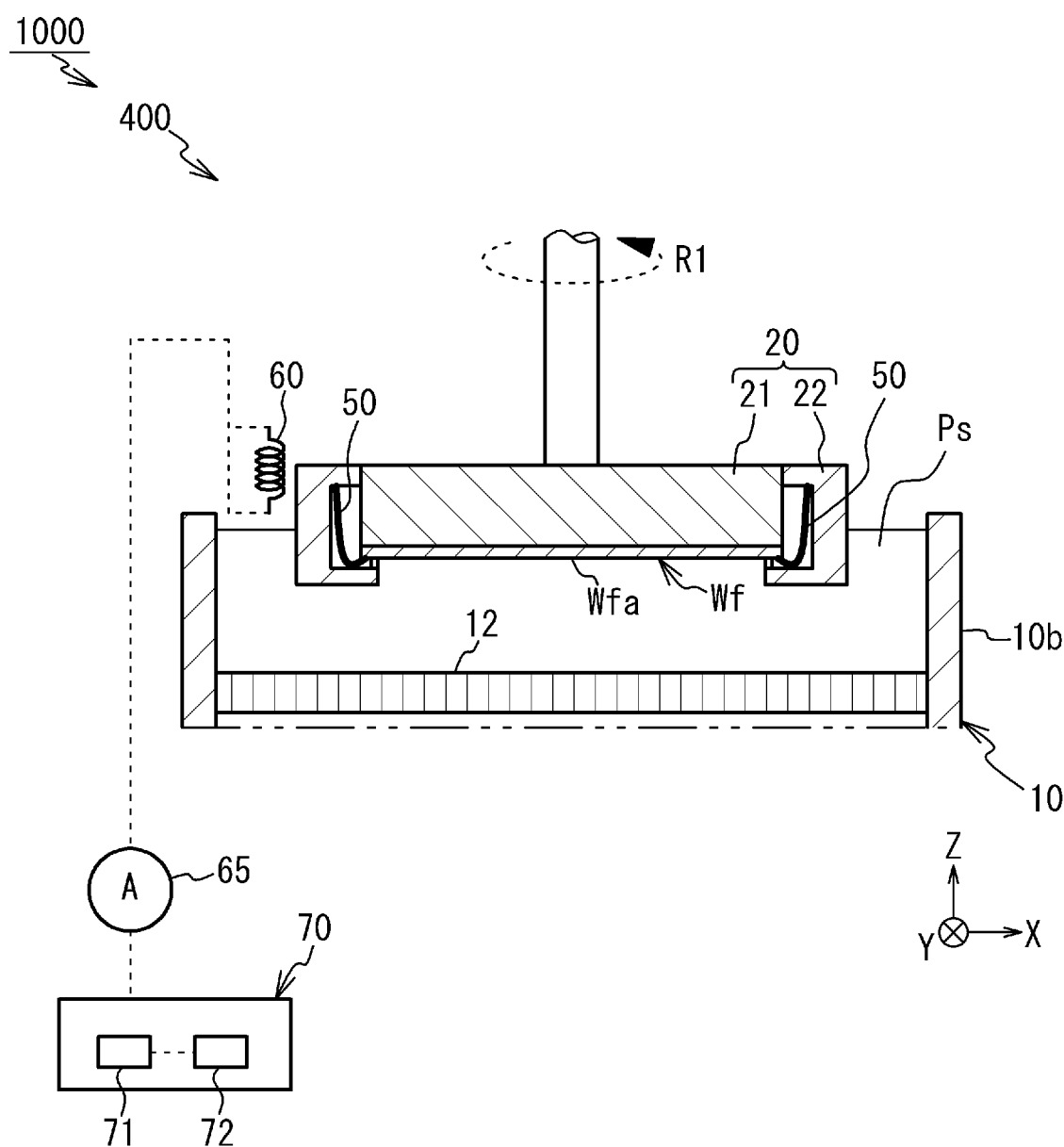
FIG. 4 is a schematic diagram illustrating a state where a substrate is immersed in a plating solution in a plating process.

FIG. 3 is a schematic diagram for describing a configuration of the plating module 400 of the plating apparatus 1000 according to this embodiment. FIG. 4 is a schematic diagram illustrating a state where a substrate Wf is immersed in a plating solution Ps when performing the plating process. The plating apparatus 1000 according to the embodiment is a cup type plating apparatus. The plating module 400 of the plating apparatus 1000 mainly includes a plating tank 10, a substrate holder 20, a rotation mechanism 30, an elevating mechanism 40, a contact member 50, a coil 60, a current sensor 65, and a film thickness measuring device 70. In FIGS. 3 and 4, cross-sectional surfaces of a part of the members of the plating apparatus 1000 (such as the plating tank 10 and the substrate holder 20) are schematically illustrated.

The plating tank 10 according to this embodiment is configured by a container having an opening in its upper side and having a bottom. Specifically, the plating tank 10 has a bottom portion 10a and an outer peripheral portion 10b that extends upward from the outer peripheral edge of this bottom portion 10a, and an upper portion of this outer peripheral portion 10b is opened. Although the shape of the outer peripheral portion 10b of the plating tank 10 is not specifically limited, the outer peripheral portion 10b according to this embodiment has a cylindrical shape as an example.

The plating tank 10 internally stores a plating solution Ps. It is only necessary that the plating solution Ps is a solution that contains metallic element ions for constituting the plating film, and the specific examples are not particularly limited. In this embodiment, a copper plating process is used as an example of the plating process, and a copper sulfate solution is used as an example of the plating solution Ps. Furthermore, in this embodiment, the plating solution Ps contains a predetermined additive. However, it is not limited to this configuration, and the plating solution Ps may have a configuration that does not contain the additive.

The plating tank 10 is provided with a supply port (not illustrated) for supplying the plating solution Ps to the plating tank 10, and a discharge port (not illustrated) for discharging the plating solution Ps from the plating tank 10. After the plating solution Ps discharged from the discharge port is temporarily stored in a reservoir tank (not illustrated), the plating solution Ps is pressure-fed by a pump (not illustrated), and supplied to the plating tank 10 from the supply port again.

The plating tank 10 internally includes an anode 11. A specific type of the anode 11 is not particularly limited, and a soluble anode and/or an insoluble anode may be used. In this embodiment, an insoluble anode is used as the anode 11. A specific type of this insoluble anode is not particularly limited, and platinum, iridium oxide, and the like may be used.

Above the anode 11 inside the plating tank 10, a porous ionically resistive element 12 is disposed. Specifically, the ionically resistive element 12 is configured by a porous plate member having a plurality of holes (pores). The plating solution Ps below the ionically resistive element 12 can pass through the ionically resistive element 12 and flow above the ionically resistive element 12. The ionically resistive element 12 is a member disposed for ensuring uniformization of an electric field formed between the anode 11 and the substrate Wf. Thus, since the ionically resistive element 12 is disposed in the plating tank 10, a uniformization of a film thickness of a plating film (plated layer) formed on the substrate Wf can be easily ensured. The ionically resistive element 12 is not an essential configuration in this embodiment, and the plating apparatus 1000 may have a configuration without the ionically resistive element 12.

The substrate holder 20 is a member capable of holding the substrate Wf as the cathode. Specifically, the substrate holder 20 is disposed above the anode 11 (further above the ionically resistive element 12 in this embodiment). The substrate holder 20 holds the substrate Wf such that the lower surface Wfa of the substrate Wf opposes the anode 11 and the ionically resistive element 12. The lower surface Wfa of the substrate Wf corresponds to the surface to be plated.

Figure 5A:
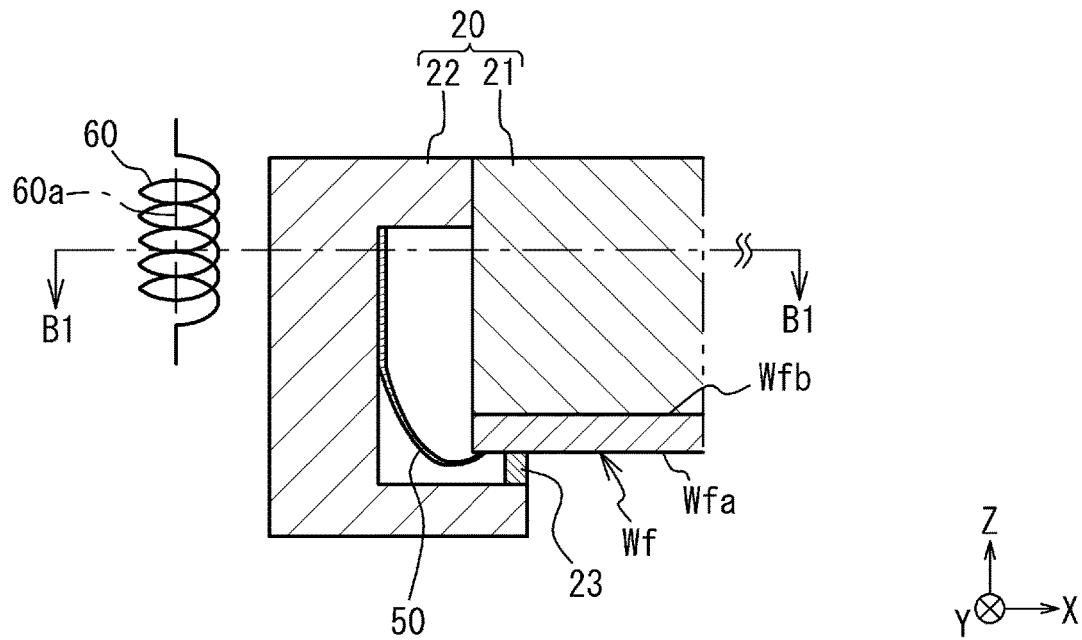
FIG. 5A is an enlarged schematic cross-sectional view illustrating a part A1 in FIG. 3.

FIG. 5A is an enlarged schematic cross-sectional view of a part A1 in FIG. 3. The substrate holder 20 according to the embodiment has a first holding member 21 and a second holding member 22. The first holding member 21 holds an upper surface Wfb of the substrate Wf. The second holding member 22 holds an outer peripheral edge of the lower surface Wfa of the substrate Wf via a sealing member 23. The substrate holder 20 holds the substrate Wf by sandwiching the substrate Wf with the first holding member 21 and the second holding member 22. The first holding member 21 has a circular plate shape, and the second holding member 22 has an approximate ring shape. The sealing member 23 is for suppressing the plating solution Ps from contacting the contact member 50 when the substrate Wf is immersed in the plating solution Ps. The sealing member 23 has a ring shape.

The above-described configuration of the substrate holder 20 is merely an example, and the substrate holder 20 is not limited to the above-described configuration insofar as the substrate holder 20 can hold the substrate Wf.

With reference to FIG. 3 again, the substrate holder 20 is connected to the rotation shaft 31 of the rotation mechanism 30. The rotation mechanism 30 is a mechanism for rotating the substrate holder 20. As the rotation mechanism 30, a known mechanism can be used, such as a motor. The elevating mechanism 40 is supported by a spindle 45 extending in the vertical direction. The elevating mechanism 40 is a mechanism for elevating the substrate holder 20 and the rotation mechanism 30 in the vertical direction. As the elevating mechanism 40, a known elevating mechanism can be used, such as a linear motion type actuator. The rotation mechanism 30 and the elevating mechanism 40 are controlled by the control module 800.

When performing the plating process on the substrate Wf the rotation mechanism 30 rotates the substrate holder 20, while the elevating mechanism 40 moves the substrate holder 20 downward, and immerses the substrate Wf in the plating solution Ps in the plating tank 10 (see FIG. 4). In a state where the substrate Wf is immersed in the plating solution Ps, an energization device (not illustrated) causes electricity to flow between the anode 11 and the substrate Wf. Accordingly, a plating film is formed on the lower surface Wfa of the substrate Wf.

An operation of the plating module 400 is controlled by the control module 800. The control module 800 includes a microcomputer, and the microcomputer includes a Central Processing Unit (CPU) 801 as a processor, a storage unit 802 as a non-transitory storage medium, and the like. The control module 800 controls the rotation mechanism 30 and the elevating mechanism 40 in the plating module 400, by the operation of the CPU 801 according to commands of a program stored in the storage unit 802.

Figure 5B:
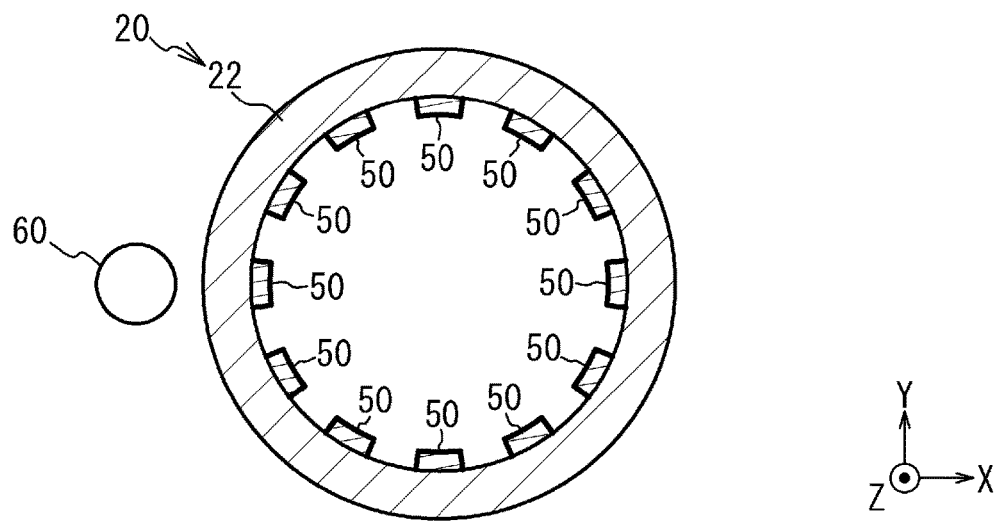
FIG. 5B is a schematic cross-sectional view illustrating a state where a cross-sectional surface of a peripheral configuration of a contact member is viewed from an upper side.

FIG. 5B is a schematic cross-sectional view illustrating a state where a cross-sectional surface (cross-sectional surface of the B1-B1 line) of a peripheral configuration of the contact member 50 is viewed from an upper side. In FIG. 5B, an illustration of the first holding member 21 is omitted. With reference to FIGS. 5(A) and 5(B), the contact member 50 is a member for supplying electricity to the substrate Wf by contacting the outer peripheral edge of the lower surface Wfa of the substrate Wf. The plurality of contact members 50 are disposed in the substrate holder 20 (specifically, the second holding member 22 in this embodiment) and arranged in a circumferential direction of the substrate holder 20.

Specifically, the plurality of contact members 50 according to the embodiment are disposed equally in the circumferential direction of the substrate holder 20. The number of the plurality of contact members 50 is not specifically limited, but in this embodiment, as an example, there are 12 pieces. The plurality of contact members 50 are electrically connected to the energization device (not illustrated), and provides the electricity supplied from the energization device to the substrate Wf.

Subsequently, the following describes the coil 60, the current sensor 65, and the film thickness measuring device 70. With reference to FIGS. 3, 4, 5(A), and 5(B), the coil 60 according to the embodiment is disposed outside the substrate holder 20 in a radial direction of the substrate holder 20. Furthermore, the coil 60 according to the embodiment is disposed to have a space from the substrate holder 20 (that is, so as not to contact the substrate holder 20).

The coil 60 is secured to the plating module 400 via a holding member (not illustrated) for holding the coil 60. The coil 60 is configured not to rotate even when the substrate holder 20 rotates. Furthermore, the coil 60 is configured to move up and down together with the substrate holder 20 when the substrate holder 20 moves up and down. Specifically, the coil 60 according to the embodiment is connected to the elevating mechanism 40 via the holding member (not illustrated). Thus, when the substrate holder 20 moves up and down, the coil 60 moves up and down with the substrate holder 20.

Furthermore, as illustrated in FIG. 4, in the embodiment, a disposed position of the coil 60 is set, such that the coil 60 does not get immersed in the plating solution Ps even when the substrate Wf is immersed in the plating solution Ps. However, it is not limited to this configuration, and for example, it may be a configuration in which the coil 60 also gets immersed in the plating solution Ps when the substrate Wf gets immersed in the plating solution Ps.

Furthermore, as illustrated in FIG. 5A, in this embodiment, the coil 60 is disposed such that a coil shaft 60a of the coil 60 extends in the vertical direction. However, the extending direction of the coil shaft 60a is not limited to this. For example, the coil shaft 60a may extend in the horizontal direction. Alternatively, the coil shaft 60a may extend in an inclined direction at an angle of more than 0° and less than 900 with respect to the horizontal direction.

Figure 6:
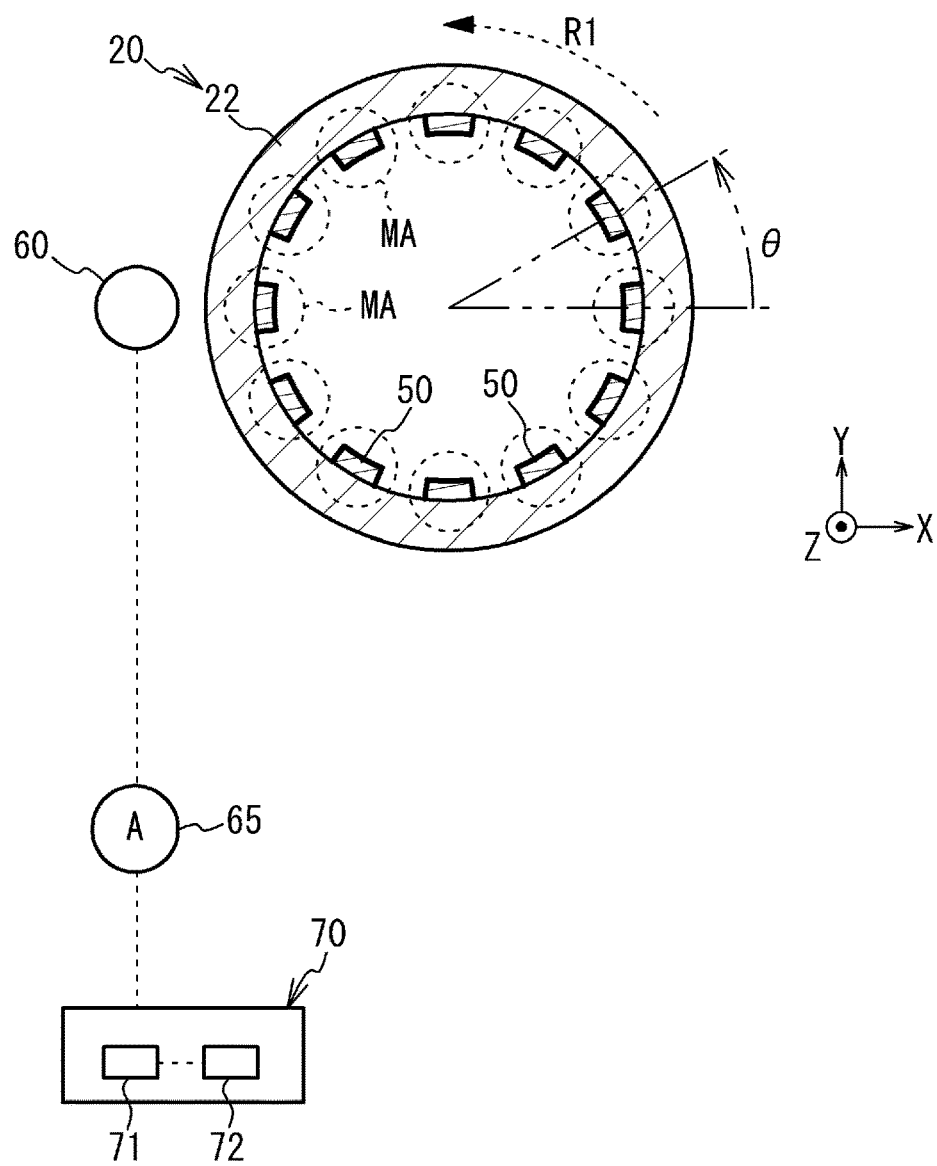
FIG. 6 is a schematic diagram for describing a film thickness measuring method according to the embodiment.

FIG. 6 is a schematic diagram for describing the film thickness measuring method. FIG. 6 illustrates a state where the second holding member 22, the contact member 50, and the coil 60 are viewed from the same direction as FIG. 5B.

When performing the plating process on the substrate Wf, a current flowing into the contact member 50 causes a magnetic field MA around the contact member 50. In the plating process, since the contact member 50 rotates with the substrate holder 20, the magnetic field MA rotates with the substrate holder 20. An electromagnetic induction due to the rotating magnetic field MA generates a current (specifically, a faint current) in the coil 60. That is, the current generated in the coil 60 is an electromagnetic current generated by the electromagnetic induction.

Specifically, a disposed position of the coil 60 according to the embodiment is adjusted such that a current is generated in the coil 60 by an electromagnetic induction due to a magnetic field MA caused by the contact member 50 that has most closely approached the coil 60, among the contact members 50 rotating together with the substrate holder 20 in the plating process.

The current sensor 65 is electrically connected to the coil 60 and detects a value of the current that has been generated in the coil 60. Specifically, the current sensor 65 according to the embodiment is configured to detect a value of a current that has been generated in the coil 60 by the electromagnetic induction due to the magnetic field MA caused by the contact member 50 that has most closely approached the coil 60, among the contact member 50 that rotates with the substrate holder 20.

The film thickness measuring device 70 is electrically connected to the current sensor 65. The film thickness measuring device 70 is disposed outside the plating tank 10 and measures a film thickness of a plating film (that is, "the film thickness of the substrate Wf") formed on the lower surface Wfa of the substrate Wf based on a current detected by the current sensor 65.

Specifically, the film thickness measuring device 70 according to the embodiment includes a microcomputer. The microcomputer includes a CPU 71 as a processor, a storage unit 72 as a non-transitory storage medium, and the like. The storage unit 72 stores a program. The film thickness measuring device 70 measures the film thickness of the substrate Wf by the operation of the CPU 71 according to commands of a program stored in the storage unit 72. A specific example of the film thickness measurement of the film thickness measuring device 70 is described in the following.

First, the smaller the value of the current flowing into the contact member 50 is (consequently, the weaker the magnetic field MA caused by the current is), the smaller the film thickness of the substrate Wf tends to become. Therefore, the smaller the film thickness of the substrate Wf is, the smaller the value of the current generated in the coil 60 becomes. Thus, a correlation relationship exists between the film thickness of the substrate Wf and the value of the current generated in the coil 60. Therefore, the film thickness measuring device 70 according to the embodiment uses the correlation relationship between the film thickness of the substrate Wf and the value of the current generated in the coil 60 to measure the film thickness of the substrate Wf.

Specifically, in the storage unit 72 of the film thickness measuring device 70 according to the embodiment, a data map specifying the relationship between the value of the current generated in the coil 60 and the film thickness of the substrate Wf is stored in advance. This data map specifies the relationship between the value of the current generated in the coil 60 and the film thickness of the substrate Wf such that the smaller the value of the current generated in the coil 60 is, the smaller the film thickness of the substrate Wf becomes. The film thickness measuring device 70 obtains the value of the current detected by the current sensor 65 (that is, the value of the current generated in the coil 60), extracts the film thickness of the substrate Wf corresponding to the value of the obtained current from the data map of the storage unit 72, and obtains the film thickness of the extracted substrate Wf as a measured value of the film thickness of the substrate Wf. As described above, the film thickness measuring device 70 measures the film thickness of the substrate Wf.

Furthermore, as described above, since the current sensor 65 according to the embodiment detects the current generated in the coil 60 by the electromagnetic induction due to the magnetic field MA caused by the contact member 50 that has most closely approached the coil 60, the film thickness measuring device 70 according to the embodiment measures the film thickness of the substrate Wf corresponding to the rotation phase (θ) of the contact member 50 that has most closely approached the coil 60.

For example, the current sensor 65 shown in FIG. 6 detects a current generated in the coil 60 by an electromagnetic induction due to the magnetic field MA caused by the contact member 50 at a position of 180° in rotation phase (θ). Subsequently, the film thickness measuring device 70 measures the film thickness of the substrate Wf at a location of 180° in rotation phase (θ) based on the current detected by the current sensor 65. This is performed every time the plurality of contact members 50 approach the coil 60. Accordingly, the film thickness measuring device 70 can measure a distribution of the film thickness in a circumferential direction of the substrate Wf (in other words, the film thickness of each rotation phase of the contact member 50).

The film thickness measuring method for the substrate Wf according to the embodiment is achieved by the above-described plating apparatus 1000. The description of the film thickness measuring method will be omitted due to duplication with the description of the plating apparatus 1000.

According to the embodiment described above, the film thickness of the substrate Wf can be measured in the plating process. Furthermore, according to the embodiment, the distribution of the film thickness in the circumferential direction of the substrate Wf can be measured as well.

As described above, while the details of the embodiment of the present invention have been described, the present invention is not limited to the specific embodiments and modifications, and various kinds of modifications and changes can further be made within the spirit of the present invention described in the claims.

REFERENCE SIGNS LIST

10 . . . plating tank
11 . . . anode
20 . . . substrate holder
30 . . . rotation mechanism
50 . . . contact member
60 . . . coil
65 . . . current sensor
70 . . . film thickness measuring device
400 . . . plating module
1000 . . . plating apparatus
Wf . . . substrate
Wfa . . . lower surface
Ps . . . plating solution
MA . . . magnetic field

The invention claimed is:

1. A plating apparatus comprising:
a plating tank configured to store a plating solution and internally including an anode;
a substrate holder disposed above the anode and configured to hold a substrate as a cathode;
a rotation mechanism configured such that the rotation mechanism rotates the substrate holder when a plating process is performed on the substrate;
a plurality of contact members disposed in the substrate holder and arranged in a circumferential direction of the substrate holder, the plurality of contact members being configured to contact an outer peripheral edge of a lower surface of the substrate to supply electricity to the substrate in the plating process;
a coil configured to generate a current by an electromagnetic induction due to a magnetic field caused by a current flowing into a contact member of the plurality of contact members, the plurality of contact members being configured to rotate together with the substrate holder in the plating process;
a current sensor configured to detect the current generated in the coil; and
a film thickness measuring device configured to measure a film thickness of the substrate based on the current detected by the current sensor in the plating process.

2. The plating apparatus according to claim 1, wherein the coil is disposed to have a space from the substrate holder outside the substrate holder in a radial direction of the substrate holder.

3. The plating apparatus according to claim 1, wherein the plurality of contact members are disposed equally in the circumferential direction of the substrate holder; and
the current sensor is configured to detect a current generated in the coil by the electromagnetic induction due to the magnetic field caused by the contact member that has most closely approached the coil, among the plurality of contact members configured to rotate together with the substrate holder in the plating process.

4. A film thickness measuring method for substrate using a plating apparatus, wherein the plating apparatus includes:
a plating tank configured to store a plating solution and internally including an anode;
a substrate holder disposed above the anode and configured to hold a substrate as a cathode;
a rotation mechanism configured such that the rotation mechanism rotates the substrate holder when performing a plating process on the substrate;
a plurality of contact members disposed in the substrate holder and arranged in a circumferential direction of the substrate holder, the plurality of contact members being configured to contact an outer peripheral edge of a lower surface of the substrate to supply electricity to the substrate in the plating process; and
a coil configured to generate a current by an electromagnetic induction due to a magnetic field caused by a current flowing into a contact member of the plurality of contact members, the plurality of contact members being configured to rotate together with the substrate holder in the plating process, wherein
the film thickness measuring method comprises:
detecting the current generated in the coil in the plating process; and
measuring a film thickness of the substrate based on the detected current.

\* \* \* \* \*